(12) United States Patent
Weber et al.

(10) Patent No.: US 10,969,699 B2
(45) Date of Patent: Apr. 6, 2021

(54) PROJECTION LIGHTING SYSTEM FOR SEMICONDUCTOR LITHOGRAPHY WITH AN IMPROVED HEAT TRANSFER

(71) Applicant: Carl Zeiss SMT GmbH, Oberkochen (DE)

(72) Inventors: Ulrich Weber, Ulm (DE); Willi Anderl, Huettlingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/541,579

(22) Filed: Aug. 15, 2019

(65) Prior Publication Data

US 2019/0384187 A1      Dec. 19, 2019

Related U.S. Application Data

(63) Continuation of application No. PCT/EP2018/052029, filed on Jan. 29, 2018.

(30) Foreign Application Priority Data

Feb. 20, 2017  (DE) .................... 10 2017 202 653.7

(51) Int. Cl.
*G03F 7/20* (2006.01)
(52) U.S. Cl.
CPC .......... *G03F 7/70875* (2013.01); *G03F 7/702* (2013.01); *G03F 7/7045* (2013.01); *G03F 7/70208* (2013.01); *G03F 7/70891* (2013.01)
(58) Field of Classification Search
CPC .................... G03F 7/70891; G03F 7/70825
See application file for complete search history.

(56) References Cited

U.S. PATENT DOCUMENTS

2011/0181852 A1  6/2011  Bleidistel et al.
2015/0103326 A1*  4/2015  Heintel ............... G03F 7/70891
                                                              355/30

FOREIGN PATENT DOCUMENTS

DE    10 2008 049 556 A1    4/2010
DE    10 2013 215 169 A1    2/2015
DE    10 2014 202 737 A1    8/2015
WO    WO 2007/128407 A1    11/2007

OTHER PUBLICATIONS

Translation of International Search Report for corresponding Appl No. PCT/EP2018/052029, dated May 28, 2018.

* cited by examiner

*Primary Examiner* — Steven Whitesell Gordon
(74) *Attorney, Agent, or Firm* — Fish & Richardson P.C.

(57) ABSTRACT

A projection exposure apparatus for semiconductor lithography has a connecting element for connecting a component of the apparatus to a supporting cooling structure of the apparatus. The connecting element has a receiving region for receiving the component, and the connecting element has a foot region for connecting the connecting element to the supporting cooling structure. At least one joint is arranged between the receiving and foot regions, and at least one heat conducting element is arranged between the receiving and foot regions. The heat conducting element is soft in the actuation direction of the joint and has a stiffness perpendicularly to the actuation direction of the joint that is at least twice as large as in the actuation direction of the joint.

20 Claims, 7 Drawing Sheets

PROJECTION LIGHTING SYSTEM FOR SEMICONDUCTOR LITHOGRAPHY WITH AN IMPROVED HEAT TRANSFER

FIELD

The disclosure relates to a projection exposure apparatus for semiconductor lithography, in particular an EUV projection exposure apparatus. Such apparatuses are used for producing very fine structures, in particular on semiconductor components or other microstructured components. The operating principle of the apparatuses is based on the production of very fine structures up to the nanometer range by way of generally reducing imaging of structures on a mask, using what is referred to as a reticle, on an element to be structured that is provided with photosensitive material. In general, the minimum dimensions of the structures produced are directly dependent on the wavelength of the light used. Recently, light sources having an emission wavelength in the range of a few nanometers, for example between 1 nm and 30 nm, in particular in the region of 13.5 nm, have been increasingly used. The described wavelength range is also referred to as the EUV range.

BACKGROUND

The optical components used for imaging for an EUV projection exposure apparatus are desirabley positioned with the greatest precision in order for it to be possible to ensure sufficient imaging quality. The components are for example field facet mirrors. A field facet mirror of this kind is known for example from WO 2007/128407 A1.

Highly thermally loaded optical components in EUV applications include field facet mirrors of which the facets are fastened to a tilting manipulator and heat dissipation takes place via corresponding joints of the manipulators.

The document DE 10 2008 049 556 A1 discloses a microlithographic projection exposure apparatus that has a mirror arrangement with a main body and a plurality of mirror units. These units each include a mirror and a flexure, which is connected to the main body by at least one joint part. An adjusting device makes it possible to alter the orientation of each particular mirror relative to the main body. In order to reduce its flexural rigidity, the joint part is subdivided into a plurality of spaced-apart joint elements. Moreover, the mirror units have heat conducting elements that do not help to support the mirror, and are connected to the mirrors and extend in the direction of the main body such that heat can be transferred from the heat conducting elements to the main body.

SUMMARY

The present disclosure seeks to develop a projection exposure apparatus for semiconductor lithography in terms of its components. In particular, mirror arrangements are intended to be provided in which the heat that arises in the mirrors can be dissipated particularly readily such that overheating can be avoided reliably.

In one aspect, the disclosure provides a projection exposure apparatus for semiconductor lithography, which has a connecting element for connecting a component of the apparatus to a supporting cooling structure of the apparatus. The connecting element has a receiving region for receiving the component, and the connecting element has a foot region for connecting to the supporting cooling structure. At least one joint is arranged between the receiving region and the foot region, and at least one heat conducting element is arranged between the receiving region and the foot region. The heat conducting element is configured to be soft in the actuation direction of the joint, and the heat conducting element has a stiffness perpendicularly to the actuation direction of the joint that is at least twice as high as in the actuation direction of the joint.

A projection exposure apparatus for semiconductor lithography includes a connecting element for connecting a component of the apparatus to a supporting cooling structure. The connecting element has a receiving region for receiving the component and a foot region for connecting to the supporting cooling structure of the projection exposure apparatus. At least one joint is arranged between the receiving region and the foot region and at least one heat conducting element is arranged between the receiving region and the foot region.

In this case, the heat conducting element is configured to be soft in the actuation direction of the joint and has a stiffness perpendicularly to the actuation direction of the joint that is at least twice as high as in the actuation direction of the joint.

In other words, the disclosure creates a heat conducting element that is flexible in the actuation direction but nevertheless has a defined stiffness. In contrast in particular to highly flexible wires or bands, the joint used according to the disclosure makes it possible to calculate the stiffness thereof exactly. In contrast thereto, a wire for example can join together attachment points at its ends in a wide variety of ways and therefore has an undefined stiffness.

In particular, the joint can be stiffer at least by a factor of 50 perpendicularly to the actuation direction than the heat conducting element.

In an advantageous embodiment of the disclosure, the joint can be a flexure. As a result, the desired kinematics of a manipulator in conjunction with connecting elements are configured in a further defined manner. The force used for driving a manipulator is defined via the stiffness of the flexure in conjunction with the stiffness of the heat conducting element.

In other words, the heat conducting element can be configured to be soft in the actuation direction of the joint. The heat conducting element itself contains in its design a kind of follower joint, which is much softer in the actuation direction of the joint and is optionally nevertheless embodied in a rigid or likewise flexible manner in other, non-actuated spatial directions. Preferably, the actuation of the joint is not further influenced or impeded by the mechanical properties of the heat conducting element. Thus, in a connecting element, the mechanical properties and the thermal conductivity can be considered to be separate and mutually independent degrees of freedom. The stiffness and the kinematic action of the joint or of the follower joint can be exactly calculated and structurally defined by the geometric dimensions, the position in the connecting element, the orientation and other material parameters. In the case of follower joints, the shape, position and orientation relative to the at least one joint are suitably dimensioned.

In an advantageous variant of the disclosure, the joint and the heat conducting element are formed in one piece. In this case, the connecting element has a first region, which serves for the mechanical actuation and holding of the element, and a second region, which, as a result of its geometric design, preferably ensures improved thermal transport through the connecting element. In this way, an improvement in heat dissipation within a compact, thermally loaded optical assembly can be realized.

In other words, the one-piece connecting element no longer has to be produced from a plurality of parts by joining methods. However, it can consist of several materials that meet the desired properties of good thermal conductivity and provide the desired flexibility and at the same time stiffness for mechanical actuation. The basic material for producing such connecting elements can consequently consist of a plurality of material types, for example of composite material. Nevertheless, there are also homogeneous materials that have all the desired properties.

A one-piece embodiment of the connecting element does not have to be associated with the above-described design of the heat conducting element. In this case, it is in particular also conceivable to form the heat conducting element without defined, direction-dependent stiffnesses, for example as a wire, wire cable or band.

Suitable materials for the heat conducting elements are in particular silicon, silicon compounds or metals, in particular copper and copper alloys. These materials have particularly high thermal conductivity and can be processed readily even in precision applications. The materials should have good thermal conductivity of more than 100 W/(m·K), preferably more than 300 W/(m·K) and a high yield point Rp0.2 of more than 200 MPa. A long service life with a cycle number of more than 1 000 000 cycles should also be aspired to.

A one-piece connecting element can be produced from monolithic basic material or from composite materials by erosion or high-speed milling. As a result, no additional thermal or mechanical joining methods, for example welding, soldering or clamping, as production processes are involved.

A respective design solution can ensure both good stiffness in conjunction with good elasticity in the actuation direction and also, at the same time, good thermal conductivity. However, with a connecting element according to the disclosure, the kinematics and heat conduction can be largely optimized independently of one another as separate degrees of freedom. As a result, all of the available installation space is used up for the best possible heat conduction.

As a result of the solution according to the disclosure, excess heat is dissipated efficiently from a thermally loaded optical assembly.

In an advantageous variant of the disclosure, the heat conducting element can be formed in an interrupted manner along a connecting straight line through the attachment points of the heat conducting element in the receiving region and in the foot region of the connecting element. As a result, the heat conducting element is embodied in a soft manner in terms of its degrees of freedom determining the kinematics compared with the stiffness of the joint. In other words, the heat conducting element does not extend or only partially extends along the connecting straight line through the attachment points of the heat conducting element in the receiving region and in the foot region. Consequently, it has kinks or bends and thus portions which do not lie on the connecting straight line.

Advantageously, the heat conducting element can be in the form of a flat, angled element. As a result, the heat conducting element is sufficiently soft and flexible to not impair the desired stiffness of the manipulator device. Such embodiments do not result in a significant increase in actuating force of the manipulator.

In an advantageous embodiment of the disclosure, the heat conducting element can have portions that extend obliquely with respect to the connecting straight line. In a particularly preferred configuration, the heat conducting element can have portions that extend perpendicularly to the connecting straight line. The attachment points in the receiving region and those in the foot region consequently do not have to be arranged one directly above the other. Using a partially oblique or perpendicular course of the heat conducting elements, the heat dissipation can take place at particularly suitable points, for example in the foot region and the supporting cooling structure of a field facet mirror.

Advantageously, the heat conducting element can have a central part connected to at least one leaf-spring-like portion. In the case of follower joints, the shape, position and orientation relative to the direction of movement of the at least one joint are suitably dimensioned.

As mentioned above, the heat conducting element can have a wire-like portion, in particular in a one-piece embodiment of the connecting element. In order to avoid overheating of a mirror, the mirror unit has metal threads as heat conducting elements, the one ends of which are connected in one piece or in a joined manner to the component and the other ends of which are connected in one piece or in a joined manner to the foot region in a thermally conductive manner. The wires are preferably made of metal and allow heat dissipation from the thermally loaded mirror to the heat sink in the foot region. The diameter of the metal wires is small enough for them to have high flexibility. As a result, the metal wires provide only an extremely small resistance to the pivoting movements of the mirror. Suitable metals are in particular copper, copper alloys, and silver and silver alloys. Via wire-like portions, flexible heat conducting structures are formed in a manner acting identically to a follower joint. The use of wires is advantageous particularly in cases in which the connecting element can be actuated in more than one degree of freedom, in particular in two degrees of freedom.

BRIEF DESCRIPTION OF THE DRAWINGS

Exemplary embodiments and variants of the disclosure are explained in more detail in the following text with reference to the drawings, in which.

BRIEF DESCRIPTION OF EXEMPLARY EMBODIMENTS

Figure 1:
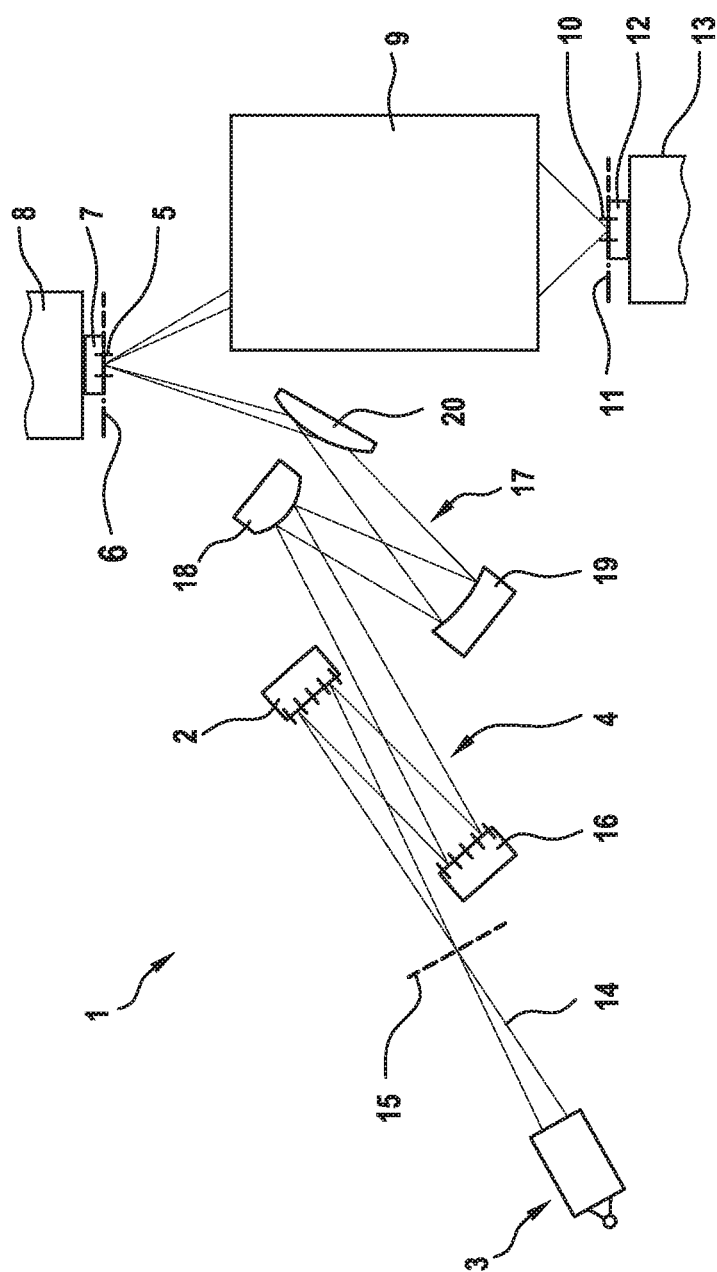
FIG. 1 shows an example of the basic construction of an EUV projection exposure apparatus, in which the disclosure can find application.

FIG. 1 shows an example of the basic construction of a microlithographic EUV projection exposure apparatus 1, in which the disclosure can find use. An illumination system of the projection exposure apparatus 1 has, in addition to a light source 3, an illumination optical unit 4 for the illumination of an object field 5 in an object plane 6. EUV radiation 14 in the form of optical used radiation generated by the light source 3 is aligned via a collector, which is integrated in the light source 3, in such a way that the radiation passes through an intermediate focus in the region of an intermediate focal plane 15 before it is incident on a field facet mirror 2. Downstream of the field facet mirror 2, the EUV radiation 14 is reflected by a pupil facet mirror 16. With the aid of the pupil facet mirror 16 and an optical assembly 17 having mirrors 18, 19 and 20, field facets of the field facet mirror 2 are imaged into the object field 5.

A reticle 7, which is arranged in the object field 5 and held by a schematically illustrated reticle holder 8, is illuminated. A projection optical unit 9, illustrated merely schematically, serves for imaging the object field 5 into an image field 10 in an image plane 11. A structure on the reticle 7 is imaged onto a light-sensitive layer of a wafer 12, which is arranged in the region of the image field 10 in the image plane 11 and is held by a wafer holder 13 that is likewise illustrated in part. The light source 3 can emit used radiation in particular in a wavelength range of between 5 nm and 30 nm.

Figure 2:
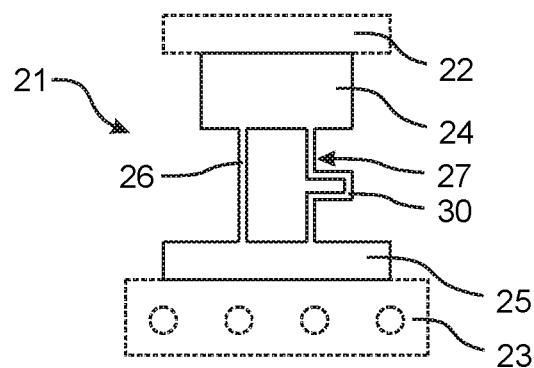
FIG. 2 schematically shows a cross section through a connecting element according to the disclosure having a cooling structure and an optical component.

FIG. 2 schematically shows a cross section through a connecting element 21 according to the disclosure having a supporting cooling structure 23 and an optical component 22. The connecting element 21 consists of a receiving region 24 for the optical component 22 and of a foot region 25. In this configuration, a joint 26 in the form of a flexure, and a heat conducting element 27 are located between the receiving region 24 and foot region 25. The heat absorbed by the optical component 22 is passed into the supporting cooling structure 23, which serves as a heat sink, by the foot region 25 via the joint 26 and the heat conducting element 27. Alternatively, the foot region 25 can itself be embodied as a cooling structure. Furthermore, the supporting cooling structure 23 and the foot region 25 can be configured in one part and thus be added to the connecting element 21 in one piece.

The heat conducting element 27 contains a projecting follower joint 30, which is much softer than the joint 26 in the actuation direction of the latter. The joint 26, which determines the kinematics, is distinguished by the fact that it establishes the desired movability between the receiving region 24 and the foot region 25. Forces that do not contribute toward the deflection of the kinematics are supported by this joint 26. Thus, the joint 26, which is embodied for example as a leaf spring, allows a horizontal displacement and tilting of the receiving region 24 with respect to the foot region 25 about an axis perpendicular to the leaf-spring plane. In the process, the joint 26 supports a vertical force between the receiving region 24 and the foot region 25 without significant deformation. By contrast, the follower joint 30 of a heat conducting element 27 has both the movability of the joints 26 determining the kinematics and also an additional softness in order not to impede the kinematics. To this end, additional horizontal bending pieces that render the follower joint 30 compliant in a vertical direction have been added to the follower joint 30 such that no noticeable force can be exerted on the follower joint 30 in a vertical direction toward the receiving region 24 or the foot region 25.

Figure 3:
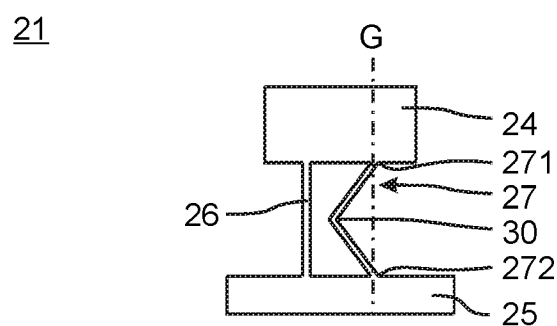
FIG. 3 schematically shows a cross section through a further connecting element.

FIG. 3 schematically shows a cross section through a further connecting element 21. The difference between a joint 26 that determines the kinematics of an optical component and a heat conducting element 27 that does not influence the kinematics is that the heat conducting element 27 does not extend along a connecting straight line G through the attachment points 271, 272 of the heat conducting element in the receiving region 24 and in the foot region 25. The follower joint 30 consists of two bending pieces that are oriented obliquely to the longitudinal axis of the joint 26, such that the follower joint 30 is compliant both transversely and parallel to the longitudinal axis of the joint 26. In this case, the follower joint 30 does not exert high forces on the receiving region 24 and the foot region 25 either transversely or parallel to the longitudinal axis of the joint 26. As a result of the bending point that is formed, the heat conducting element 27 is formed in a correspondingly softer manner compared with the stiffer joint 26.

Figure 4:
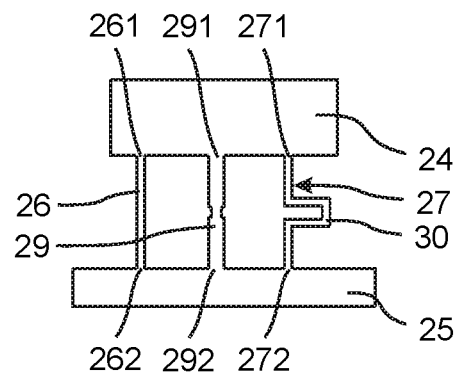
FIG. 4 schematically shows a cross section through a further configuration of a connecting element.

FIG. 4 schematically shows a cross section through a further configuration of a connecting element 21. In this FIG. 4, too, the difference between the different joints 26, 29 that determine the kinematics and a heat conducting element 27 that does not determine the kinematics is illustrated. The joints 26, 29 are distinguished by the fact that there is a direct connection between their attachment points 261, 291 in the receiving region 24 and their attachment points 262, 292 in the foot region 25. In this case, a joint 29 has a material narrowing in order to set the stiffness accordingly. Such joints 26, 29 can themselves be configured as leaf springs. By contrast, the heat conducting element 27 is distinguished by the fact that there is no rectilinear connection between its attachment points 271 in the receiving region 24 and its attachment points 272 in the foot region 25. The direct rectilinear connection is interrupted by the projection of the follower joint 30. Thus, the heat conducting element 27 is much softer in terms of the degrees of freedom determining the kinematics than the joints 26, 29, for which a certain stiffness is desired for actuation.

Figure 5:
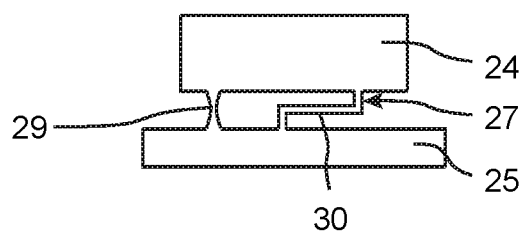
FIG. 5 schematically shows a cross section through a further configuration of a connecting element with a material narrowing.

FIG. 5 schematically shows a cross section through a further configuration of a connecting element 21 having a joint 29 with a material narrowing, which is constricted in its middle proceeding from the receiving region 24 to the foot region 25. The follower joint 30 of the heat conducting element 27 is embodied as a leaf spring. The horizontally extending leaf-spring plane intersects the material narrowing of the joint 29. The follower joint 30 supports the joint 29 having a material narrowing during the transmission of forces in the leaf-spring plane. For forces in a perpendicular direction to the leaf-spring plane, the follower joint 30 again behaves in a soft manner.

Figure 6:
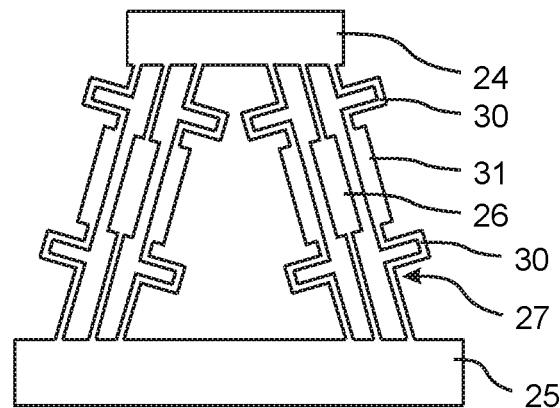
FIG. 6 schematically shows a cross section through a further configuration of a connecting element with one degree of freedom.

FIG. 6 schematically shows a cross section through a further configuration of a connecting element 21 having thickened intermediate parts 31 in the follower joint 30. This is a uniaxial manipulator having one degree of freedom. These thickened intermediate parts 31 are also integrated into the heat conducting element 27 in a monolithic manner or in one piece. The softness of the heat conducting element 27 in the actuation direction results again from the in this case two follower joints 30, which enclose the intermediate part 31. Such thickened portions increase the heat dissipation in the heat conducting element 27 and are incorporated into the structure at points that are unimportant for the kinematics.

Figure 7:
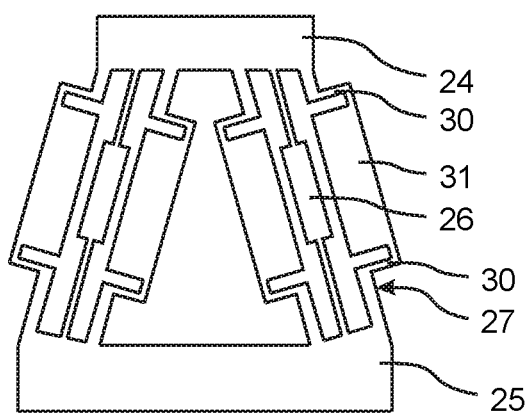
FIG. 7 schematically shows a cross section through a further configuration of a connecting element with one degree of freedom.

FIG. 7 schematically shows a cross section through a further configuration of a connecting element 21 having thickened intermediate parts 31 in the heat conducting element 27. The follower joints 30 are leaf springs, the leaf-spring planes of which are arranged perpendicularly to the longitudinal axis of the heat conducting element 27. As in FIG. 6, the manipulator is a uniaxial manipulator having one degree of freedom.

Figure 8:
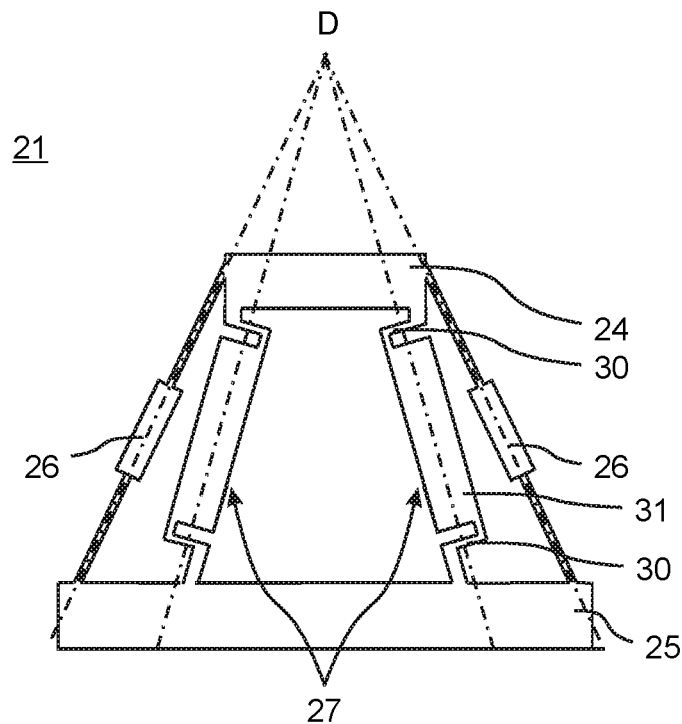
FIG. 8 schematically shows a cross section through a further configuration of a connecting element with one degree of freedom.

FIG. 8 schematically shows a cross section through a further configuration of a connecting element with one degree of freedom. The heat conducting elements 27 and the joints 26 are in this case oriented such that their longitudinal axes intersect at a fulcrum D of the kinematics. Again, the leaf-spring planes of the follower joints 30 are oriented perpendicularly to the respective longitudinal axes of the heat conducting elements 27.

Figure 9:
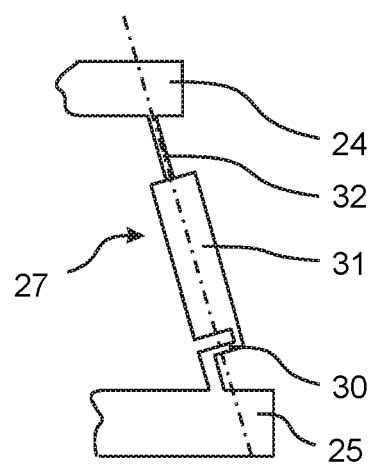
FIG. 9 schematically shows a cross section through an alternative embodiment of a heat conducting element with a follower joint.

FIG. 9 illustrates an alternative embodiment of a heat conducting element 27 having a follower joint 30. The upper attachment to the receiving region 24 is embodied as a leaf spring 32, which is oriented parallel to the longitudinal axis of the heat conducting element 27. The lower attachment to the foot region 25 is embodied by a follower joint 30 having a leaf spring, which is oriented perpendicularly to the longitudinal axis of the heat conducting element 27. This arrangement represents a space-saving and yet efficient kinematic decoupling of the heat conducting element 25.

Figure 10:
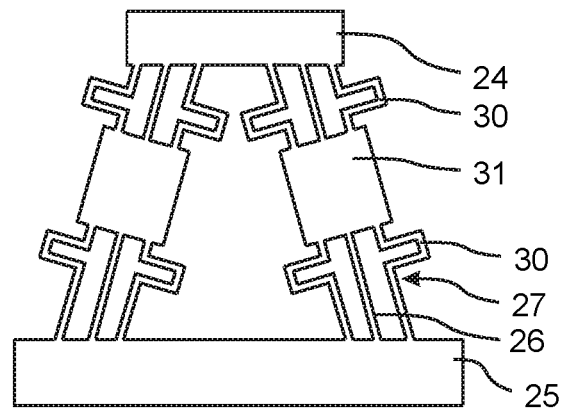
FIG. 10 schematically shows a cross section through an alternative embodiment of a connecting element with a common intermediate part.

FIG. 10 schematically shows a cross section through an alternative embodiment of a connecting element 21 with a common intermediate part 31. The flexible follower joints 30 and the joint 26 are connected to a common intermediate part 31. In this way, the installation space can be filled optimally with heat conducting material, with the result that the heat exchange from the receiving region 24 to the foot region 25 is enhanced further.

Figure 11:
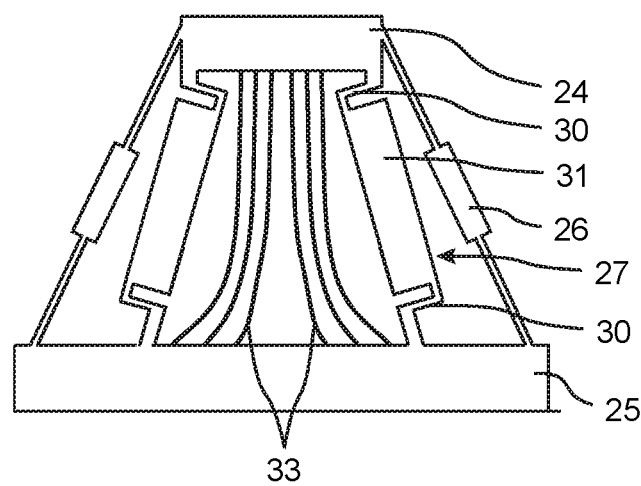
FIG. 11 schematically shows a cross section through an alternative embodiment of a connecting element with wire-like heat conducting elements.

FIG. 11 schematically shows a cross section through an alternative embodiment of a connecting element 21 with additional wire-like heat conducting elements 33. In order to bring about a further increase in the heat dissipation from the receiving region 24 to the foot region 25, the connecting element 21 has metal threads as heat conducting elements 33, the one ends of which are connected in one piece to the receiving region 24 in a thermally conducting manner and the other ends of which are connected in one piece to the foot region 25 in a thermally conducting manner. Alternatively, these additional heat conducting elements 33 can also be connected via joining methods, for example welding, soldering or clamping. The wires can be round material or material with a rectangular or square cross section. The wires can consist of a bundle or braid. Bands are also considered here. The diameter of the metal wires is in any case small enough for them to have high flexibility. As a result, the metal wires provide only an extremely small resistance to the pivoting movements of the mirror. In the example shown, only a uniaxial manipulator is shown. However, the use of wire-like heat conducting elements is also advantageous for use in multiaxial manipulators, for example in biaxial manipulators as in the German laid-open specification DE 10 2013 214 407 A1, which originates from the applicant and is hereby fully incorporated herein by reference.

Figure 12:
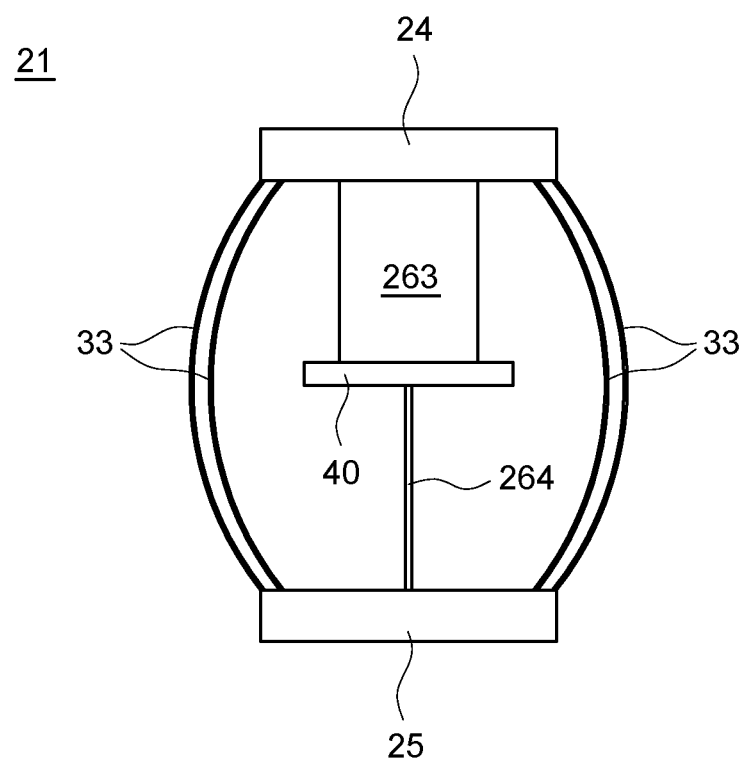
FIG. 12 schematically shows a cross section through an alternative embodiment of a connecting element with wire-like heat conducting elements and two degrees of freedom.

FIG. 12 schematically shows a cross section through an alternative embodiment of a connecting element 21 with additional wire-like heat conducting elements 33 and two degrees of freedom. Consequently, a biaxial manipulator is illustrated in the example shown. This manipulator consists of two types of joints 263, 264 that act perpendicularly to one another, are connected together via an intermediate part 40 and connect the receiving region 24 and the foot region 25. The first joint 263 serves for tilting in the direction perpendicular to the plane of the drawing, i.e. about a tilt axis lying in the plane of the drawing. The second joint 264 serves for tilting in the plane of the drawing, i.e. about an axis perpendicular to the plane of the drawing. In order to bring about a further increase in the heat dissipation from the receiving region 24 to the foot region 25 for biaxial manipulators, too, the connecting element 21 has metal threads as heat conducting elements 33, the one ends of which are connected in one piece or in a joined manner to the receiving region 24 in a thermally conducting manner and the other ends of which are connected in one piece or in a joined manner to the foot region 25 in a thermally conducting manner. The diameter of the metal wires is again small enough for them to have high flexibility. As a result, the metal wires provide only an extremely small resistance to the pivoting movement of the mirror.

LIST OF REFERENCE SIGNS

1 Projection exposure apparatus
2 Optical assembly; field facet mirror
3 Light source
4 Illumination optical unit
5 Object field
6 Object plane
7 Reticle
8 Reticle holder
9 Projection optical unit
10 Image field
11 Image plane
12 Wafer
13 Wafer holder
14 EUV radiation
15 Intermediate focal plane
16 Pupil facet mirror
17 Optical assembly
18 Mirror
19 Mirror
20 Mirror
21 Connecting element
22 Component, optical component
23 Supporting cooling structure
24 Receiving region
25 Foot region
26 Joint, flexure
261 Attachment point of the joint in the receiving region
262 Attachment point of the joint in the foot region
263 Joint for tilting about an axis within the image plane
264 Joint for tilting about an axis perpendicular to the image plane
27 Heat conducting element
271 Attachment point of the heat conducting element in the receiving region
272 Attachment point of the heat conducting element in the foot region
29 Joint with material narrowing
291 Attachment point of the joint in the receiving region
292 Attachment point of the joint in the foot region
30 Follower joint
31 Intermediate part
32 Leaf spring
33 Wire 40 Intermediate part
G Straight line
D Fulcrum

What is claimed is:

1. An apparatus, comprising:
a component;
a supporting cooling structure; and
a connecting element comprising a joint and a heat conducting element,
wherein:
the connecting element connects the component to the supporting cooling structure;
the connecting element has a receiving region that receives the component;
the connecting element has a foot region connected to the supporting cooling structure;
the joint is between the receiving and foot regions;
the heat conducting element is between the receiving and foot regions;
the heat conducting element contacts the receiving region only in a first region;
the heat conducting element contacts the foot region only in a second region;
without a force applied to the heat conducting element:
a first straight line extends from the first region to the second region;
a second straight line is parallel to the first straight line;
the second straight line does not intersect the first region or the second region; and
the second straight line intersects the heat conducting element;
the heat conducting element has portions extending perpendicular to the connecting straight line; and
the apparatus is a semiconductor lithography projection exposure apparatus.

2. The apparatus of claim 1, wherein the joint comprises a flexure.

3. The apparatus of claim 1, wherein the joint and the heat conducting element are a single piece.

4. The apparatus of claim 1, wherein the heat conducting element is a flat, angled element.

5. The apparatus of claim 1, wherein the heat conducting element has portions extending obliquely relative to the connecting straight line.

6. The apparatus of claim 1, wherein the heat conducting element comprises a central part and a leaf-spring-like portion, wherein the central part is connected to the leaf-spring-like portion.

7. The apparatus of claim 1, wherein the connecting element is actuatable in more than one degree of freedom.

8. The apparatus of claim 7, wherein the connecting element allows tilting about two axes.

9. The apparatus of claim 1, wherein the optical component comprises a mirror.

10. The apparatus of claim 1, wherein the optical component comprises a facet mirror.

11. The apparatus of claim 1, wherein the optical component comprises a field facet mirror.

12. The apparatus of claim 1, further comprising an illumination system, wherein the optical component is in the illumination system.

13. The apparatus of claim 12, wherein the optical component comprises a facet mirror.

14. The apparatus of claim 12, further comprising a projection optical unit.

15. The apparatus of claim 1, wherein:
a stiffness of the joint in the direction perpendicular to the actuation direction of the joint is at least 50 times the stiffness of the heat conducting element in the direction perpendicular to the actuation direction of the joint; and
the joint comprises a flexure.

16. The apparatus of claim 1, wherein:
a stiffness of the joint in the direction perpendicular to the actuation direction of the joint is at least 50 times the stiffness of the heat conducting element in the direction perpendicular to the actuation direction of the joint; and
the joint and the heat conducting element are a single piece.

17. An apparatus, comprising:
a component;
a supporting cooling structure; and
a connecting element comprising a joint and a heat conducting element,
wherein:
the connecting element connects the component to the supporting cooling structure;
the connecting element has a receiving region that receives the component;
the connecting element has a foot region connected to the supporting cooling structure;
the joint is between the receiving and foot regions;
the heat conducting element is between the receiving and foot regions;
the heat conducting element contacts the receiving region only in a first region;
the heat conducting element contacts the foot region only in a second region;
without a force applied to the heat conducting element:
a first straight line extends from the first region to the second region;
a second straight line is parallel to the first straight line;
the second straight line does not intersect the first region or the second region; and
the second straight line intersects the heat conducting element;
the apparatus is a semiconductor lithography projection exposure apparatus;
a stiffness of the heat conducting element in a direction perpendicular to an actuation direction of the joint is at least twice a stiffness of the heat conducting element in the actuation direction of the joint;
the joint and the heat conducting element are a single piece;
the heat conducting element has portions extending obliquely relative to the connecting straight line; and
the heat conducting element has portions extending perpendicular to the connecting straight line.

18. The apparatus of claim 17, wherein a stiffness of the joint in a direction perpendicular to an actuation direction of the joint is at least 50 times the stiffness of the heat conducting element in a direction perpendicular to the actuation direction of the joint.

19. The apparatus of claim 17, further comprising an illumination system, wherein the optical component is in the illumination system.

20. The apparatus of claim 19, wherein the optical component comprises a facet mirror.

* * * * *

UNITED STATES PATENT AND TRADEMARK OFFICE
CERTIFICATE OF CORRECTION

PATENT NO. : 10,969,699 B2
APPLICATION NO. : 16/541579
DATED : April 6, 2021
INVENTOR(S) : Ulrich Weber and Willi Anderl Page 1 of 1

It is certified that error appears in the above-identified patent and that said Letters Patent is hereby corrected as shown below:

In the Specification

Column 1, Line 28, delete "desirabley" and insert -- desirably --.

Signed and Sealed this
Eighth Day of June, 2021

Drew Hirshfeld
*Performing the Functions and Duties of the*
*Under Secretary of Commerce for Intellectual Property and*
*Director of the United States Patent and Trademark Office*